United States Patent [19]

Anderton et al.

[11] Patent Number: 5,596,228
[45] Date of Patent: Jan. 21, 1997

[54] APPARATUS FOR COOLING CHARGE COUPLED DEVICE IMAGING SYSTEMS

[75] Inventors: Richard L. Anderton, West Jordan; Steven E. Curtis, Salt Lake City, both of Utah

[73] Assignee: OEC Medical Systems, Inc., Salt Lake City, Utah

[21] Appl. No.: 508,576

[22] Filed: Jul. 28, 1995

Related U.S. Application Data

[63] Continuation of Ser. No. 209,001, Mar. 10, 1994, abandoned.

[51] Int. Cl.$^6$ ............................. H01L 23/34; H05K 7/20
[52] U.S. Cl. ..................... 257/714; 257/712; 257/715; 257/716; 361/689; 361/698; 361/699; 361/702
[58] Field of Search ................................. 257/712, 713, 257/714, 715, 716; 361/689, 698, 699, 702, 711

[56] References Cited

U.S. PATENT DOCUMENTS 4,253,515  3/1981  Swiatosz ........................... 257/716
5,216,580  6/1993  Davidson et al. ................... 365/385

*Primary Examiner*—Carl Whitehead, Jr.
*Attorney, Agent, or Firm*—Thorpe North & Western, L.L.P.

[57] ABSTRACT

Apparatus for cooling charge-coupled device (CCD) imaging systems. The apparatus comprises a thermoelectric cooler thermally coupled to the imaging system for transferring heat away from and cooling the imaging system portion of the imaging system. The thermoelectric cooler has a cold side and an opposing hot side, with the cold side thermally coupled to the imaging sensor to enable the transfer of heat from the sensor in response to a supply of power. A power supply is coupled to the cooler for supplying required power. The hot side of the cooler is thermally coupled to a heat pipe, which is composed of a heat-conducting material having a hollow portion containing a wicking material and a working fluid. A heat sink is thermally coupled to the heat pipe enabling heat dissipation. The working fluid cyclically evaporates into vapor and condenses into liquid to effect the heat transfer from the heat pipe to the heat sink.

15 Claims, 1 Drawing Sheet

APPARATUS FOR COOLING CHARGE COUPLED DEVICE IMAGING SYSTEMS

This application is a continuation of application Ser. No. 08/209,001, filed Mar. 10, 1994 now abandoned.

BACKGROUND OF THE INVENTION

This invention relates generally to a method and apparatus for providing efficient and sensitive x-ray imaging equipment. More particularly, the invention relates to a method and apparatus for cooling charge-coupled device-containing imaging systems and the like.

Two-dimensional charge-coupled device (CCD) arrays can be substituted for tube-type cameras or film as the imaging device in imaging systems. In the most straightforward operational mode a CCD image is acquired as a snapshot, analogous to the operation of a photographic camera. Due to their high sensitivity, CCD imaging systems are ideally suited for digital imaging of x-ray images as well as other types of images. For example, CCD imaging systems are used routinely in astronomy and have been used recently in the field of molecular genetics for digital imaging of electrophoretic gels and hybridization blots. Achim E. Karger et al., *Line Scanning System for Direct Digital Chemiluminescence Imaging of DNA Sequencing Blots*, 65 Anal. Chem. 1785 (1993).

An area CCD array is composed of two major functional components, a parallel register consisting of a two-dimensional array of light-sensitive CCD elements, organized, for example, in 576 lines of 384 elements each for a 586×384 pixel array, and a single-line linear output register positioned along one side of the parallel register and connected to the on-chip amplifier. Photons striking the CCD surface generate photoelectrons that are trapped in the CCD element nearest the location of photon incidence. After the array has been exposed to light, readout of the photogenerated charge is performed by simultaneously shifting the charge packets of all lines in parallel toward the output register. Having arrived at the output register, the charge packets are shifted one by one in the perpendicular direction toward the on-chip amplifier for subsequent analog to digital conversion.

Cryogenically cooled, low-noise CCD imaging systems are particularly well suited for low light level imaging because of their high sensitivity, linear response to incident photons, and wide dynamic range. CCD imaging systems maintained at low temperature are highly sensitive because of improved signal-to-noise ratios over systems maintained at higher temperature. Low temperature operation of CCD imaging systems increases the range of light levels readable by the imaging system, thus providing a wide dynamic range of incident light levels that can be imaged. Further, low temperature operation of CCD imaging systems provides for realization of the full utility of high resolution chips used with the imaging system. CCD systems used in the environment are typically categorized as being in the "scientific class," and generally acquire data slowly.

Faster scan CCD systems, used in conventional 30 frame per second acquisition, can also benefit from active cooling. A compact, yet effective, design for active cooling would be beneficial since it is desirable to take advantage of the inherent compactness that a CCD imaging system allows. Thus, a compact way of removing heat would be important, instead of depending on more bulky conventional methods, like fans and close proximity heat sinks.

In view of the foregoing, it will be appreciated that providing a method and apparatus for cooling CCD imaging systems and the like that avoid the problems and disadvantages of conventional methods and apparatus would be a significant advancement in the art.

OBJECTS AND SUMMARY OF THE INVENTION

It is an object of the present invention to provide a method and apparatus for cooling charge-coupled device imaging systems and the like.

It is also an object of the invention to provide a method and apparatus for maintaining a charge-coupled device at low temperature for obtaining a high signal-to-noise ratio.

It is another object of the invention to provide a method and apparatus for cooling charge-coupled imaging systems in connection with x-ray imaging equipment in which a wide dynamic range of incident light levels may be utilized.

It is still another object of the invention to provide a method and apparatus for cooling charge-coupled imaging systems in connection with x-ray imaging equipment in which the full utility of high resolution chips is realized.

It is yet another object of the invention to avoid the problems associated with previously known methods of cooling CCD imaging systems, such as fans and close-proximity heat sinks.

These and other objects are accomplished by providing apparatus for cooling a CCD imaging system, and in particular the imaging sensor portion of the system, and the like, comprising a thermoelectric cooler thermally coupled to the imaging system for transferring heat therefrom to thereby cool and maintain the imaging sensor at a predetermined temperature (for example, selected to track near room ambient temperature). The thermoelectric cooler has a cold side and an opposing hot side, with the cold side thermally coupled to the imaging sensor for transferring heat away from the imaging sensor to thereby cool the sensor in response to a supply of power. A power supply is coupled to the cooler for supplying power thereto. The hot side of the cooler is thermally coupled to a heat pipe, which is composed of a heat-conducting material having a hollow portion containing a wicking material and a working fluid. A heat sink is thermally coupled to the heat pipe for removing heat therefrom.

The apparatus functions by providing a heat flow path from the imaging sensor to the heat sink. Upon heating of the heat pipe, the working fluid in an evaporation region of the heat pipe is caused to evaporate, thus removing heat from the hot side of the thermoelectric cooler. The evaporation of the working fluid effects an increase of pressure within the heat pipe, thereby causing the vapor of the working fluid to condense into a liquid in a portion of the heat pipe proximal to the heat sink, concomitantly transferring heat from the working fluid to the heat sink. The liquid is returned through the wicking material to the evaporation region so that the evaporation-condensation cycle can operate continuously.

DETAILED DESCRIPTION OF THE INVENTION

Figure 1:
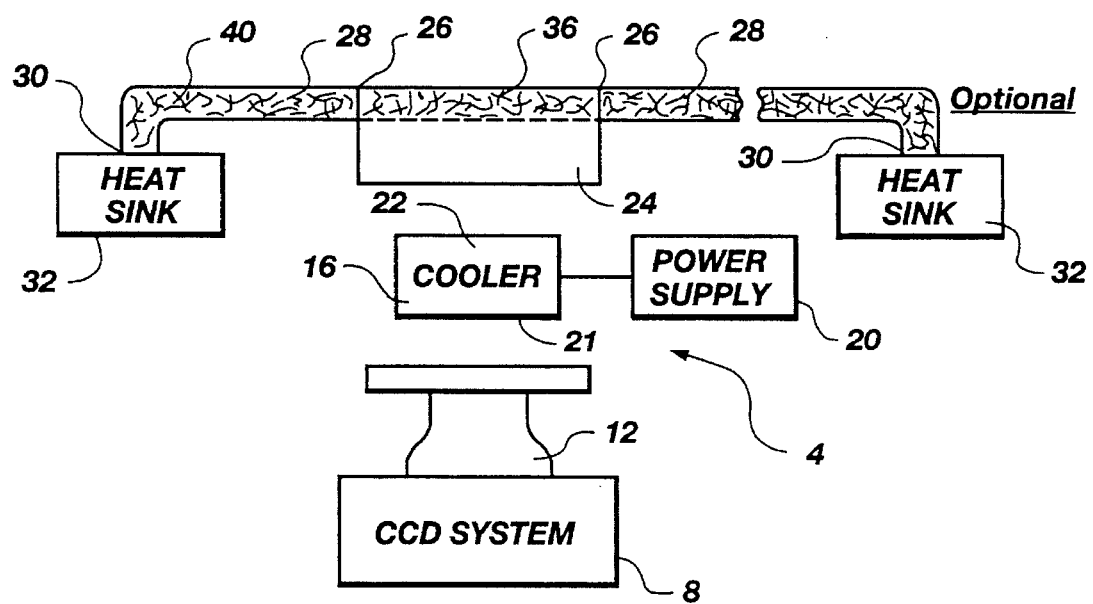
FIG. 1 is a schematic diagram of apparatus for cooling CCD imaging systems and the like in accordance with the present invention.

Before the present method and apparatus for cooling charge-coupled device imaging systems and the like are disclosed and described, it is to be understood that this invention is not limited to the particular process steps and materials disclosed herein as such process steps and materials may vary somewhat. It is also to be understood that the terminology used herein is used for the purpose of describing particular embodiments only and is not intended to be limiting since the scope of the present invention will be limited only by the appended claims and their equivalents.

It must be noted that, as used in this specification and the appended claims, the singular forms "a," "an," and "the" include plural referents unless the content clearly dictates otherwise. Thus, for example, reference to "a heat sink" includes two or more heat sinks, reference to "a thermoelectric cooler" includes reference to two or more of such coolers, and reference to "a heat pipe" includes reference to two or more heat pipes.

Referring to FIG. 1, there is shown an apparatus 4 for cooling a CCD imaging system 8 and the like. The apparatus 4 comprises a block or cold shoe 12 disposed on the CCD imaging system 8 for transferring heat away from the CCD imaging system 8. There is preferably a substantial amount of surface area of the cold shoe 12 in contact with the CCD imaging system 8 to facilitate rapid transfer of heat away from the CCD imaging system 8. The cold shoe 12 is comprised of a heat-conducting material. Suitable heat-conducting materials include aluminum and/or copper. Copper is especially preferred.

A portion of the cold shoe 12 that is distal to the CCD imaging system 8 is disposed in heat transfer relationship with a thermoelectric cooler or Peltier-effect cooler 16 (known in the art). The cooler 16 transfers heat away from the cold shoe 12 in response to a supply of power from a power supply 20 to which the cooler is coupled. The impedance of the power supply 20 can be adjusted to select the final (steady state) cooling capacity. A delay in turning on the power supply 20 from the time of delivering power to the imaging system 8 can also be selected to control cooling transients caused by the thermoelectric cooler 16 and power dissipation from the system.

The thermoelectric cooler 16 has opposing cold 21 and hot 22 sides and is positioned such that the cold side 21 is in heat transfer relationship or abuts the cold shoe 12. Thus, the cold side 21 of the thermoelectric cooler 16 chills the cold shoe 12, which cools the CCD imaging system 8.

As earlier indicated, the thermoelectric cooler 16 is electrically powered by the power supply 20 and operates to maintain the cold side 21 of the cooler 16 to follow room ambient temperature, since cooling below room temperature may cause undesirable moisture condensation in a humid environment. This is accomplished, as known in the field of thermodynamics, by the thermoelectric cooler 16 transferring heat from its cold side 21 to its hot side 22 by means of the electric power supplied to it by the power source 20. The thermoelectric cooler 16 maintains a substantially constant temperature differential between the hot side 22 and cold side 21. The temperature of the cold side 21 is responsive to variation in the temperature of the hot side 22 such that any increase or decrease in the temperature of the hot side 22 brings about a corresponding equal increase or decrease in the temperature of the cold side 21. Heat is continually removed from the hot side 22 of the thermoelectric cooler 16 by a second heat-conducting block 24 to maintain the respective temperatures of the hot side 22 and cold side 21 at predetermined or selectable levels. Otherwise, the thermoelectric cooler 16 will overheat and "burn out" if the hot side 22 and cold side 21 get too hot.

The second block 24 of heat-conducting material is positioned in heat transfer relationship with the hot or distal side 22 of the cooler 16. This second block 24 preferably is shaped to have a large surface area proximal to the hot side 22 of the cooler 16 for maximizing heat transfer therefrom. The second block 24 also contains an opening 26 through which a heat pipe 28 extends (but the second block 24 could also simply be in thermal contact with the pipe 28). The second block 24 is comprised of a heat conducting material. The heat conducting materials described above and used in the cold shoe 12 are also suitable in fabricating the second block 24. As with the cold shoe 12, copper is the preferred heat conducting material in the second block 24.

The heat pipe 28 is also composed of a heat conducting material for receiving heat from the second block 24 and conducting the heat away from the block 24. The heat pipe 28 is comprised of an elongate tubular wall circumscribing a hollow portion. The heat pipe 28 has two ends 30, each of which is disposed on a heat sink 32. (A single heat sink 32, with one end 30 of the heat pipe 28, could also be utilized.) The heat sinks 32 will be described more fully momentarily. A middle portion of the heat pipe 28 extends through the opening 26 in the second block 24 to define an evaporation region 36 of the heat pipe 28, which will be described in more detail below. The hollow portion of the heat pipe 28 contains a wicking material 40 and a working fluid, such as water.

The wicking material 40 is used in the heat pipe 28 for transporting and distributing the working fluid throughout the heat pipe 28. The functionality of the wicking material 40 is more critical to the operation of the apparatus 4 than is the particular material that is used. The operation of the apparatus 4 will be described below, but for understanding the function of the wicking material 40 it is sufficient to realize that a cycle of evaporation and condensation of the working fluid in the heat pipe 28 is involved. The working fluid evaporates into vapor in the evaporation region 36 and condenses into a liquid at the ends 30 of the heat pipe proximal to the heat sinks 32. The liquid that condenses at the ends 30 of the heat pipe 28 must then be transported back to the evaporation region 36. This transport is accomplished by wicking of the liquid working fluid through the wicking material 40. Thus, the wicking material 40 can be any material compatible with the range of temperatures and the working fluid encountered in the heat pipe 28 and which conducts liquid working fluid by capillary action. A preferred wicking material is sintered copper.

The working fluid is selected for its ability to evaporate from liquid into vapor and then condense into a liquid at suitable temperatures. The working liquid is also selected for its compatibility with the materials comprising the heat pipe 28 and the wicking material 40. Suitable working fluids include methanol, ethanol, water, and mixtures thereof. Water is a preferred working fluid.

As the second block 24 receives heat from the hot side 22 of the cooler 16, heat is transferred to the heat pipe 28, especially in the evaporation region 36 since it is the evaporation region that is directly coupled to the second block 24. The heat received by the heat pipe 28 is in turn transferred to the working fluid, causing the working fluid to evaporate into vapor. This change of state occurs primarily in the evaporation region of the heat pipe, but some evaporation may also occur outside of the evaporation region 36. The evaporation of the working fluid causes the pressure in the heat pipe to rise, thus causing vapor at the ends 30 of the heat pipe 28 to condense into liquid working fluid and give up heat to the heat sinks 32. The heat sinks might illustratively be large masses of metal, such as copper or aluminum, or other thermally conductive material. The heat sink is preferably positioned such that it effectively tracks ambient temperature.

The liquid working fluid that condenses at the ends 30 of the heat pipe 28 is carried back to the evaporation region 36 by capillary action through the wicking material 40. This cycle of evaporation and condensation of the working fluid operates on a continuing basis to transfer heat received by the heat pipe 28 to the heat sinks 32.

The CCD imaging system is cooled in the following manner. The cold side 21 of the thermoelectric cooler 16 is maintained at a temperature sufficient to mechanically chill the cold shoe 12, which in turn cools the CCD imaging system 8 to, for example 25° C. In effect, the cold shoe 12 cools the CCD imaging system 8 by mechanically removing heat from it. This heat is in turn mechanically removed from the cold shoe 12 by the cold side 21 of the thermoelectric cooler 16. The heat is then transferred from the cold side 21 to the hot side 22 of the thermoelectric cooler 16 in response to the supply of electric power from the power supply 20. The heat is mechanically transferred from the hot side 22 of the thermoelectric cooler 16 to the second block 24, which transfers it to the heat pipe 28. The heat pipe 28 then transfers heat to the working fluid, resulting in evaporation and conversion of the working fluid to the vapor state. This raises the pressure within the heat pipe 28, stimulating the condensation of the vapor into a liquid at the interface of the heat pipe 28 with the heat sink 32, and concomitantly transferring the heat to the heat sink 32.

The temperature differential maintained between the hot side 22 and the cold side 21 of the thermoelectric cooler 16 provides that the CCD imaging system 8, cold shoe 12, and cold side 21 remain cold, and the hot side 22, second block 24, heat pipe 28, and heat sink 32 remain hot.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

We claim:

1. Apparatus for cooling a charge-coupled device imaging system, containing an imaging sensor, and the like comprising a thermoelectric cooler thermally coupled to said system for transferring heat therefrom to cool the imaging sensor to approximately an ambient temperature, said thermoelectric cooler having a cold side and an opposing hot side, said cold side being thermally coupled to said imaging sensor to thereby cool the sensor in response to a supply of power;

a power supply coupled to the cooler for supplying power thereto;

a heat pipe means thermally coupled to said hot side for transferring heat therefrom, the heat pipe means comprising a tubular heat-conducting wall circumscribing a hollow portion, and a wicking material and a working fluid disposed in the hollow, and a heat sink thermally coupled to the heat pipe means for transferring heat therefrom, and wherein the heat sink comprises a mass of thermally conductive material disposed so that it tracks ambient temperature.

2. Apparatus of claim 1 wherein the working fluid is selected from the group consisting of water, methanol, ethanol, and mixtures thereof.

3. Apparatus of claim 2 wherein the working fluid is water.

4. Apparatus of claim 1 further including a first block of thermally conductive material disposed between the imaging system and the cooler, and a second block of thermally conductive material disposed between the cooler and the heat pipe means.

5. Apparatus of claim 4 wherein said thermally conductive material is selected from the group consisting of copper, aluminum, and mixtures thereof.

6. Apparatus of claim 5 wherein the thermally conductive material is copper.

7. Apparatus of claim 1 wherein the wicking material comprises sintered copper.

8. A method of cooling a charge-coupled device imaging system and the like which controls moisture by ambient temperature tracking, comprising (a) providing apparatus for cooling a charge-coupled device imaging system, containing an imaging sensor, and the like comprising a thermoelectric cooler thermally coupled to said system for transferring heat therefrom to cool the imaging sensor to a reduced temperature, said thermoelectric cooler having a cold side and an opposing hot side, said cold side being thermally coupled to said imaging system to thereby cool the imaging sensor in response to a supply of power, such that the thermoelectric cooler provides ambient temperature tracking to control moisture;

a power supply coupled to the cooler for supplying power thereto;

a heat pipe thermally coupled to said hot side for transferring heat therefrom, the heat pipe comprising a tubular heat-conducting wall circumscribing a hollow portion that contains a wicking material and a working fluid; and a heat sink thermally coupled to the heat pipe for transferring heat therefrom, and wherein the heat sink comprises a mass of thermally conductive material so positioned so that it tracks ambient temperature; and (b) activating the power supply to provide power to the thermoelectric cooler for cooling the imaging sensor.

9. The method of claim 8 wherein heat transfer from the heat pipe to the heat sink is effected by evaporation of the working fluid into vapor, thereby transferring heat from the heat pipe to the vapor and causing an increase of pressure within the heat pipe, followed by condensation of the vapor into liquid in a portion of the heat pipe proximal to the heat sink, thereby transferring heat from the working fluid to the heat sink.

10. The method of claim 8 wherein the working fluid is selected from the group consisting of water, methanol, ethanol, and mixtures thereof.

11. The method of claim 10 wherein the working fluid is water.

12. The method of claim 8 wherein the cold side of the thermoelectric cooler is coupled to the imaging sensor through a first block of thermally conductive material, and the hot side of the thermoelectric cooler is coupled to the heat pipe through a second block of thermally conductive material.

13. The method of claim 12 wherein said thermally conductive material is selected from the group consisting of copper, aluminum, and mixtures thereof.

14. The method of claim 13 wherein the thermally conductive material is copper.

15. The method of claim 8 wherein the wicking material comprises sintered copper.

\* \* \* \* \*